United States Patent [19]
Grundy et al.

[11] 3,968,481
[45] July 6, 1976

[54] METHOD OF, AND APPARATUS FOR, ESTABLISHING SELF-BIASED SINGLE WALL DOMAINS

[75] Inventors: Philip J. Grundy, Sale, England; Yeong S. Lin, Mount Kisco, N.Y.

[73] Assignee: International Business Machines (IBM), Armonk, N.Y.

[22] Filed: July 25, 1974

[21] Appl. No.: 491,918

[52] U.S. Cl. ............................................. 340/174 TF
[51] Int. Cl.² ........................................... G11C 11/15
[58] Field of Search ............................. 340/174 TF

[56] References Cited
UNITED STATES PATENTS
3,678,478   7/1972   Copeland, III ............... 340/174 TF OTHER PUBLICATIONS
Journal of Applied Physics — vol. 42, No. 4, Mar. 15, 1971, pp. 1360–1361.

IBM Technical Disclosure Bulletin — vol. 15, No. 8, Jan. 1973, pp. 2652–2654.

Primary Examiner—James W. Moffitt
Attorney, Agent, or Firm—Pollock, Vande Sande & Priddy

[57] ABSTRACT

A method of and apparatus for providing single wall self-biased magnetic domains in a film of uniaxial magnetic material. In addition to the conventional uniaxial magnetic film for supporting the single wall domains, a bias film is located adjacent thereto. The material characteristics of the two films and their thicknesses are chosen such that the exchange coupling between the two films provides the effect of an external field for supporting the single wall domains.

19 Claims, 5 Drawing Figures

METHOD OF, AND APPARATUS FOR, ESTABLISHING SELF-BIASED SINGLE WALL DOMAINS

FIELD OF THE INVENTION

The present invention relates to single wall magnetic domain devices or more popularly magnetic bubble devices. More particularly, the invention relates to a method of and apparatus for supporting single wall magnetic domains without the requirement of an external magnetic field.

BACKGROUND OF THE INVENTION

Single wall magnetic domains or magnetic bubbles have been recognized for a number of years and much work appears in the published and patent literature concerning the application of this phenomenon to diverse devices. In a majority of these applications, however, an external magnetic field is required to stably support the single wall domains or magnetic bubbles. In particular, the external magnetic field is required to assure reproducible bubble generation and maintain bubbles of substantially constant size and stability for propagation and sensing purposes. The requirement of this external magnetic field leads to complications in device application since field coils must be provided to generate the magnetic field. The presence of the field coils inhibits the freedom of the designer in laying out the device' structure and adds complications such as a requirement for a power source for the field coil and in some applications even cooling structures for cooling the field coils.

A number of suggestions have been made in the prior art for elimination of the external magnetic field. Typical of these proposals are two Bobeck patents, U.S. Pat. No. 3,529,303 and U.S. Pat. No. 3,714,640; a Copeland Patent, U.S. Pat. No. 3,678,478; and an article entitled "Internal Bias Effect of Double Layer Epitaxial Garnet Films" appearing in *IEEE Transactions on Magnetics*, Volume MAG-9, No. 3, September 1973, beginning at page 381 by Uchishiba et al.

The solution suggested by Bobeck, however, requires a permanent magnetic material overlying the magnetic film supporting the magnetic domains. This sheet of permanent magnetic material interferes with the operation of domain propagating arrangements and furthermore, it has been found, that the effective field supplied by this arrangement is not sufficient to support optimum sized domains. For efficient utilization, of course, it is desired that the diameter of the domains be as small as possible. Because of the interrelation between material characteristic and film thickness, this generally requires relatively thick film and it has been found with such films that the permanent magnetic layer of Bobeck supplies an inadequte field strength.

The Copeland arrangement requires a plurality of stacked layers of materials in which domains can be moved. Of course, this is entirely inadequate where only a single layer of domains is desired and the multilayer arrangement complicates the interconnection problem.

The Uchishiba article specifies only a few particular combinations of materials in which it has been found that the internal bias is sufficient to support the magnetic domains. The article does not provide a basis for using materials other than those expressly disclosed in the article. In other words there is no teaching of a systematic basis or criteria for selecting appropriate materials and the parameters for a self-biased structure for supporting single wall domains.

SUMMARY OF THE INVENTION

The present invention provides an internally biased single wall domain supporting structure which may comprise a single layer and which is applicable to a broad range of materials, both crystalline and amorphous. Furthermore, the internal bias provided is sufficient to support optimum sized domains. The invention includes a method for preparing the inventive apparatus.

On a suitable substrate a bias layer is deposited. Adjacent the bias layer a storage layer is deposited. The storage layer is comparable to the prior art magnetic films for supporting magnetic domains, while the bias layer of uniaxial magnetic material provides the magnetic forces to replace the magnetic field necessary to support stable domains of optimum size. The thickness and material length of the bias layer are selected in relation to the thickness and material length of the storage layer such that the ratio of thickness and material length of the bias layer is less than the ratio of the thickness and material length in the storage layer. Material length is a characteristic of the material and is related to the domain diameter at which the domain collapses in response to increasing bias field; this characteristic of the material is more particularly defined, for instance in U.S. Pat. No. 3,508,221, see column 2, beginning at line 46. Even more particularly the ratio of the thickness and material length in the bias layer is less than 1 while the ratio of the thickness and material length of the storage layer is in the range between 4 and 10. Preferably, the ratio of thickness and material length of the bias layer is ≤ 0.5.

Suitable domain propagation means may then be deposited adjacent the storage layer as is conventional in the art.

We have found that the reason the self-bias of the Bobeck device is inadequate to support optimum sized domains is related to the fact that he employs a permanent magnetic layer as the source of magnetic field. The high coercivity of the permanent magnetic layer forces the domain interface to reside in the storage layer.

By properly adjusting the parameters referred to above the bias layer is maintained in the single domain state. By reason of the larger material length of the bias layer, as compared to the storage layer, the domain interface wall resides in the bias layer. With this arrangement, the exchange coupling provides the same effect as does an external magnetic field, and more importantly, provides a sufficient effect to maintain stable bubble domains in the storage layer in a range of optimum bubble diameter.

BRIEF DESCRIPTION OF THE DRAWINGS

The present invention will become apparent from this description taken in conjunction with the attached drawings in which like reference characters identify identical apparatus and in which.

DETAILED DESCRIPTION OF THE INVENTION

Figure 1:
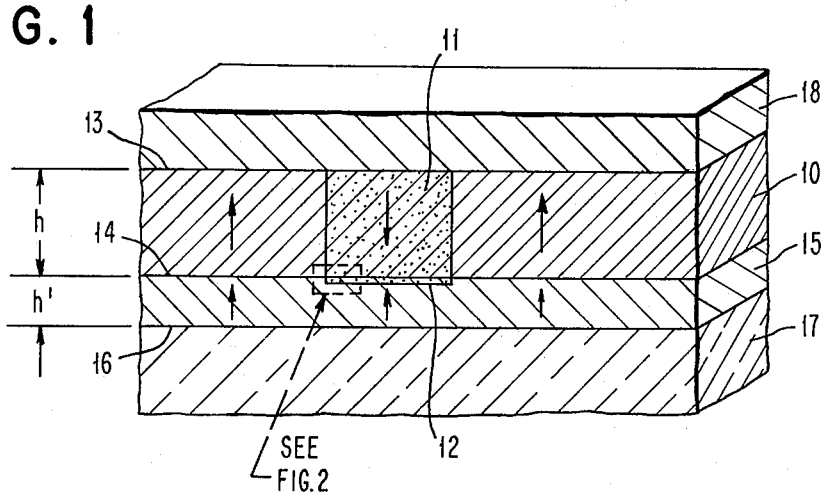
FIG. 1 is a cross section of a self-biasing bubble domain supporting structure in accordance with the present invention.

FIG. 1 illustrates a bubble domain supporting apparatus which is self-biased and which is capable of stably supporting bubbles in the optimum range of bubble diameters. More particularly, 10 is a layer of magnetic material which is capable of supporting bubble domains in a proper magnetic field such as has been described in the prior literature. More particularly, the layer 10 may comprise uniaxial crystalline or amorphous magnetic material. In the course of this description the layer 10 will be referred to as the storage layer because by far the greatest proportion of the bubble will be supported therein. It should be understood that use of the term "storage" does not mean the invention is limited to information storage devices. Rather the invention is applicable to all devices which rely on the movement or sensing of single wall magnetic domains.

Disposed directly adjacent the storage layer 10 is a bias layer 15 which is exchange coupled to the storage layer and is composed of a uniaxial magnetic material and, in accordance with the teachings of this invention comprises a soft magnetic material, one whose material length is larger than the material length of the storage layer 10. To complete the apparatus a suitable substrate 17 is provided. Furthermore, suitable domain propagation means are generally indicated at 18. The specific propagation structure is not illustrated since there are many varieties known in the art which can be used in conjunction with the device constructed in accordance with this invention.

The characteristic of the material referred to as the "material length" is a characteristic of the material which is defined specifically in terms of the domain diameter $D_c$ at which the domain collapses in response to increasing bias field. For a circular domain in "infinite" sheet of thickness $h$, the material length $$\text{length } L = 2h \left[ \frac{D_c/h}{\sqrt{1+(D_c/h)^2}} K\left(\frac{1}{1+(h/D_c)^2}\right) - \frac{D_c}{h}\sqrt{1+(D_c/h)^2} E\left(\frac{1}{1+(h/D_c)^2}\right) + \left(\frac{D_c}{h}\right)^2 \right]$$

where K and E are standard complete elliptic functions $$K(m) = \int_o^{\pi/2} \frac{d\theta}{\sqrt{1-m\sin^2\theta}}$$

$$E(m) = \int_o^{\pi/2} \sqrt{1-m\sin^2\theta}\, d\theta$$

More particularly, FIG. 1 illustrates that the storage layer 10 interfaces the bias layer 15 along the plane 14. The height or thickness of the storage layer $h$ is illustrated as relatively larger than the height $h'$ of the bias layer 15.

A method of fabricating a device in accordance with the present invention comprises the steps of depositing a bias layer 15 on a suitable substrate 17. The bias layer 15 is deposited with a height or thickness $h'$ and the material is chosen to have a relatively large material length $l'$. Above the bias layer the storage layer 10 is deposited. The storage layer 10 is deposited with a height $h$ which is relatively larger than the height $h'$ of the bias layer and with a material length $l$ which is relatively smaller than the material length of the bias layer 15. Subsequent to the step of depositing the storage layer 10 is a propagation means 18 may be deposited above the storage layer either directly on the storage layer or on an insulating layer on the storage layer. It is within the scope of the present invention to reverse the positions of the propagation means 18 and the bias layer 15 such that the propagation means 18 is deposited above the substrate 17, with the storage layer 10 deposited above the propagation means 18 and finally the bias layer 15 deposited above the storage layer. The relative positioning of the propagation means 18 and the bias layer 15 depends, of course, on the particular type of propagation means selected for use. Furthermore, the propagation means 18 need not be deposited at all. Although some propagation device is necessary for bubble propagation devices external to the chip may also be used.

Figure 3:
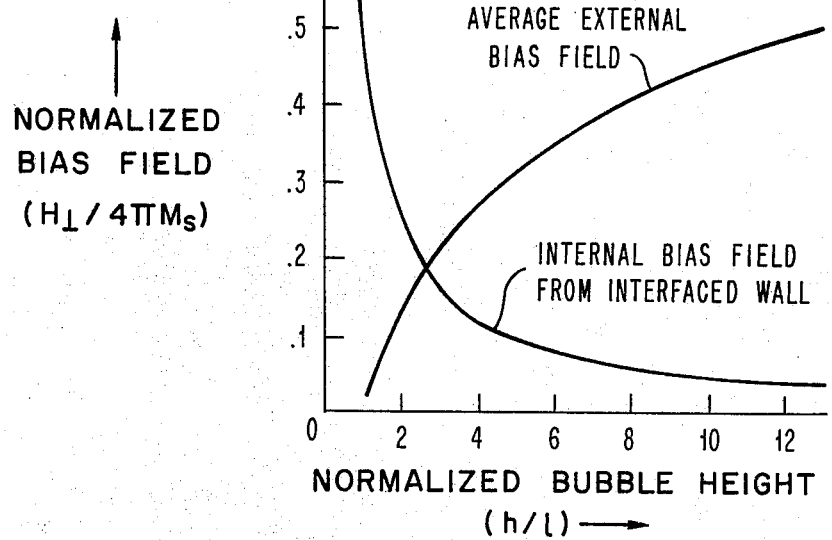
FIG. 3 is a plot of normalized bias field versus normalized bubble height in accordance with the teachings of Bobeck.

FIG. 3 illustrates characteristics of the prior art Bobeck type structures. In FIG. 3 the equivalent internal bias field which is provided by the interface wall is plotted as a function of normalized bubble height. The normalized bubble height is taken to be the ratio between the actual height (that is the thickness of the storage layer) and the material length of the storage layer. Also plotted is the average external bias field required as a function of normalized bubble height in order to stably support bubbles in the storage layer. It will be seen that the prior art Bobeck structure provides an internal bias field which is equal to or greater than the necessary bias field for bubble heights less than or equal to about 2.8. As will be apparent from reference to FIG. 5, discussed below, normalized heights of 2.8 provide bubbles whose diameter is greater than optimum. From the point of view of efficiently using space it is apparent that minimum bubble diameter is desirable. At the present state of the art the optimum bubble diameters are obtained when the normalized height is approximately in the range of 4 to 10. Thus it will be seen, that the Bobeck device provides only approximately 30% of the necessary bias field to maintain bubbles having a diameter in the optimum range. It is thus desirable to increase the effective internal bias provided by the domain wall by reason of exhange coupling.

We have found that a structure in which the interface wall resides not in the storage layer but in the bias layer provides an increased effective bias field by reason of the exchange coupling. In order to effect this we provide a bias layer of a relatively soft magnetic material, i.e., one whose material length is larger than the material length of the storage layer. However, it is also essential to maintain the bias layer in a substantially single domain state and in order to effect this the bias layer must be sufficiently thin so that a plurality of bubble domains are not generated in the bias layer.

Figure 4:
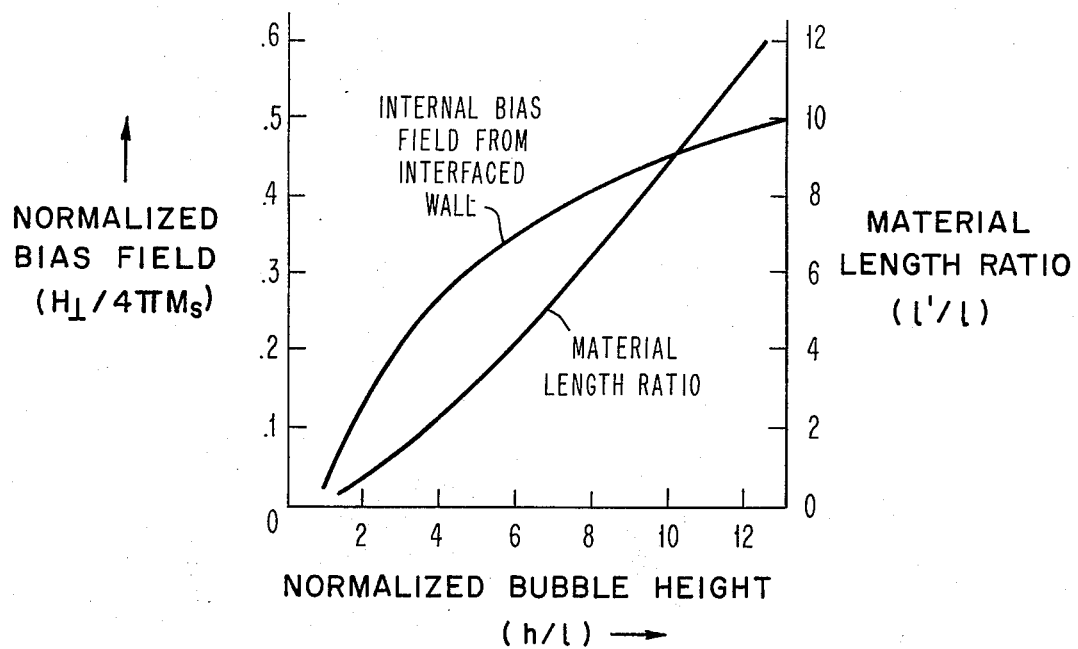
FIG. 4 is a plot of normalized bias field and material length ratio as a function of normalized bubble height in accordance with the teachings of the present invention.

FIG. 4 illustrates a plot of effective internal bias field as a function of normalized bubble height. Also shown is the material length ratio, that is the ratio of bias layer material length to storage layer material length, as a function of normalized bubble height in order to completely eliminate the external bias field.

Figure 5:
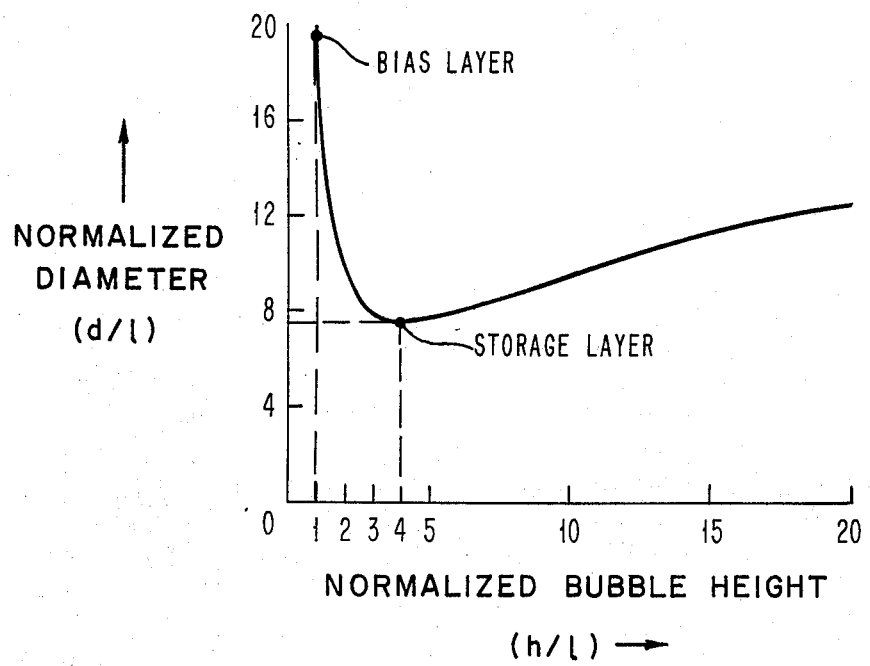
FIG. 5 is a plot of normalized bubble diameter as a function of normalized height in accordance with the teachings of the present invention.

FIG. 5 is a representation of the variation of normalized bubble diameter with respect to normalized bubble height. From this it is quite apparent that in order to obtain relatively small diameter bubbles one must employ a normalized height of approximately at least 4, and preferably in the range between 4 and 10. Referring back now to FIG. 3 showing the characteristics of the Bobeck device, and particularly the plot of internal bias field as a function of normalized bubble height, it is quite apparent that at the desirable normalized bubble height of approximately 4, the internal bias field equivalent is inadequate to supply the necessary bias field.

FIG. 1 also illustrates a representative single wall domain, or bubble, 11 existing in the storage layer 10. Actually, the bubble 11 is an area of magnetization opposed to the direction of magnetization in the surrounding portions of storage layer 10. The bubble 11 has domain walls defining the extent of bubble 11 in the storage layer 10. In accordance with the generally accepted theory, the magnetization across any elemental portion of material is continuous. As a result, the magnetization across any of the domain walls changes continuously from the upwardly directed magnetization in a majority of the storage layer 10 to the downwardly directed magnetization characteristic of the bubble 11. The bubble 11 has two further domain walls which are parallel to the longitudinal extent of storage layer 10; as shown in FIG. 1 these are horizontal. The upper of these two domain walls is defined by the upper extent of storage layer 10. The lower of these domain walls, wall 12 lies, as is illustrated in FIG. 1 in the bias layer 15. This domain wall 12 is forced into the bias layer 15 by the larger material length of bias layer 15 as compared to the material length of storage layer 10.

Figure 2:
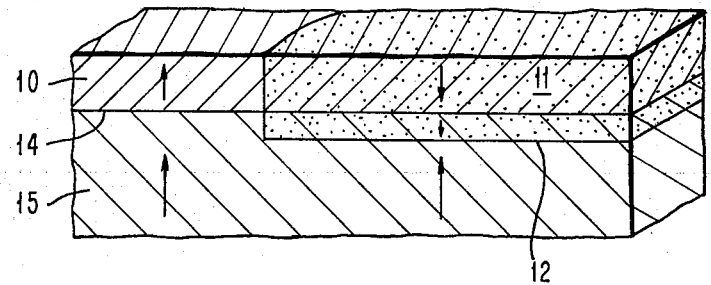
FIG. 2 is a cross section similar to FIG. 1 but on an enlarged scale to show in more detail the location of the domain interface wall.

FIG. 2 shows, in more detail, the relative location of the domain wall 12 as compared to the interface 14 of storage layer 10 and bias layer 15.

In order to achieve the objects of the present invention for the optimum range of bubble diameters, which corresponds to a normalized bubble height of from 4 to 10, the normalized bubble heights should be greater than the normalized height of the bias layer which should be less than or equal to one.

To test the efficacy of the magnetic field supplied by a bias layer adjacent to storage layer, as disclosed above, applicants provided a storage layer without an associated bias layer, and an identical storage layer with an adjacent bias layer. Applicants then tested the external magnetic field required to stably support bubbles in both devices. Although the latter device did not conform to applicants' invention, it did indicate that the required magnetic field was lower for the latter device than for the storage layer alone. This provided experimental verification. In particular, in testing, a bias layer of $Gd_{0.6}$ $Y_{1.7}$ $Yb_{.7}$ $Ga_{0.95}$ $Fe_{4.05}$ $O_{12}$ was grown on a substrate and a storage layer of $Eu_{0.6}$ $Y_{2.4}$ $Ga_1$ $Fe_4$ $O_{12}$ was grown atop the bias layer. The height of the storage layer was 4.36 microns and that of the bias layer was 1.03 microns. The material length of the storage layer was 0.5 microns and the material length of the bias layer was 0.6 microns. To determine the effect of the bias layer on the external bias field a similar storage layer was grown without a bias layer. An external field of 60 oersteds was required for the storage layer alone. The bias layer, referred to above, reduced the external field requireements to 40 oersteds, a reduction of one-third.

We claim:

1. A method of fabricating a self-biased structure for supporting and moving single wall magnetic domains comprising the steps of:

depositing on a suitable substrate, adjacent layers of bias and storage layers, said bias layer comprising a uniaxial magnetic material of thickness $h'$ and material length $l'$, to maintain a single domain state, said storage layer of uniaxial magnetic material with thickness $h$ and material length $l$, and providing domain propagating means adjacent said storage layer, wherein said parameters are chosen such that $(h/l) > (h'/l')$ with $(h'/l') \leq 1$.

2. The process of claim 1 in which said bias layer is deposited on said substrate and said storage layer is deposited on said bias layer.

3. The process of claim 1 in which the ratio of $h/l$ is in the range of 4 to 10.

4. The process of claim 1 in which $l$ is approximately equal to $l'l'$ and $h'$ is in the range of 10 to 20% of $h$.

5. The process of claim 1 in which said propagation means is deposited above said substrate, said storage layer is deposited above said propagation means and said bias layer is deposited above said storage layer.

6. A self-biased single wall domain supporting structure comprising, a substrate, a storage layer of magnetic material with thickness $h$ and material length $l$, capable of supporting stable single wall domains in a suitable external field, and a bias layer of uniaxial magnetic material exchange coupled to said storage layer of thickness $h'$ and material length $l'$ where $h'$ is sufficiently small to maintain a single domain state and $h'/l' < h/l$, whereby said bias layer provides magnetic forces simulatiing said external field.

7. The apparatus of claim 6 in which said bias layer is deposited on said substrate and said storage layer is deposited on said bias layer.

8. The apparatus of claim 6 which further includes single wall domain propagating means.

9. The apparatus of claim 6 in which, $$4 \leq h/l \leq 10$$

10. The apparatus of claim 9 in which, $$h'/l' \leq 1.$$

11. The apparatus of claim 9 in which, $$h'/l' \leq 0.5.$$

12. The apparatus of claim 6 which further includes single wall domain propagating means and in which, said bias layer is deposited on said substrate, said storage layer is deposited on said bias layer, said single wall domain propagating means is deposited on said storage layer.

13. The apparatus of claim 12 in which, $$4 \leq h/l \leq 10.$$

14. The apparatus of claim 13 in which, $$h'/l' \leq 1.$$

15. The apparatus of claim 12 in which, $$h'/l' \leq 0.5.$$

16. The apparatus of claim 6 which further comprises a single wall domain propagating means deposited on said substrate, said storage layer deposited on said single wall domain propagating means,
said bias layer deposited on said storage layer.

17. The apparatus of claim 16 in which, $$4 \leq h/l \leq 10.$$

18. The apparatus of claim 17 in which, $$h'/l' \leq 1.$$

19. The apparatus of claim 17 in which, $$h'/l' \leq 0.5.$$

* * * * *

UNITED STATES PATENT AND TRADEMARK OFFICE
CERTIFICATE OF CORRECTION

PATENT NO. : 3,968,481
DATED : July 6, 1976
INVENTOR(S) : Grundy et al

It is certified that error appears in the above-identified patent and that said Letters Patent are hereby corrected as shown below:

In column 1, line 20, correct the spelling of --field--, line 30, change "device'" to --device's--.

In column 3, line 68, insert a space between "h" and "is".

In column 4, line 57, correct the spelling of --change--.

In column 6, line 29, delete one "1'".

In column 8, line 7, delete entire line.

Signed and Sealed this

Fifth Day of October 1976

[SEAL]

Attest:

RUTH C. MASON
Attesting Officer

C. MARSHALL DANN
Commissioner of Patents and Trademarks